US010843587B2

(12) United States Patent
Tagade et al.

(10) Patent No.: US 10,843,587 B2
(45) Date of Patent: Nov. 24, 2020

(54) METHOD OF DETERMINING STATE OF CHARGE OF BATTERY AND BATTERY MANAGING APPARATUS

(71) Applicant: SAMSUNG ELECTRONICS CO., LTD., Suwon-si (KR)

(72) Inventors: Piyush Tagade, Bangalore (IN); Krishnan S Hariharan, Bangalore (IN); Tae Won Song, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 244 days.

(21) Appl. No.: 15/605,005

(22) Filed: May 25, 2017

(65) Prior Publication Data
US 2017/0343612 A1    Nov. 30, 2017

(30) Foreign Application Priority Data

May 26, 2016   (IN) .............................. 201641018153
Dec. 28, 2016  (IN) .............................. 201641018153
Mar. 30, 2017  (KR) ........................ 10-2017-0040563

(51) Int. Cl.
| G01R 31/26  | (2020.01) |
| B60L 58/12  | (2019.01) |
| H01M 10/48  | (2006.01) |
| G01R 31/367 | (2019.01) |
| G01R 31/382 | (2019.01) |

(Continued)

(52) U.S. Cl.
CPC ............ B60L 58/12 (2019.02); G01R 31/367 (2019.01); G01R 31/3648 (2013.01); G01R 31/382 (2019.01); H01M 10/482 (2013.01);

H01M 10/486 (2013.01); G01R 31/392 (2019.01); H01M 2220/20 (2013.01)

(58) Field of Classification Search
None
See application file for complete search history.

(56) References Cited

U.S. PATENT DOCUMENTS 10,496,371 B2 * 12/2019  Li ........................... H04L 9/08
2008/0094031 A1  4/2008  Singh et al.
(Continued)

FOREIGN PATENT DOCUMENTS

| JP | 2007-024687 A  | 2/2007 |
| JP | 2013-0445984 A | 3/2013 |

(Continued)

OTHER PUBLICATIONS

Piyush Tagade, Bayesian calibration for electrochemical thermal model of lithium-ion Cells, Apr. 29, 2016, pp. 296-309. (Year: 2016).*

(Continued)

Primary Examiner — Tung S Lau
(74) Attorney, Agent, or Firm — NSIP Law

(57) ABSTRACT

Disclosed is a battery state of charge (SOC) determining method and a battery managing apparatus that acquires a stochastic reduced order model (SROM) and a mean using battery conservation equations acquired based on a stochastic Pseudo 2-dimensional electrochemical thermal (P2D-ECT) model, measures state information, and assimilates the state information with the SROM and the mean to determine an accurate SOC at a relatively low calculation cost.

19 Claims, 20 Drawing Sheets

(51) Int. Cl.
    *G01R 31/36*     (2020.01)
    *G01R 31/392*     (2019.01)

(56) References Cited

U.S. PATENT DOCUMENTS

| | | | |
|---|---|---|---|
| 2017/0168119 A1* | 6/2017 | Tagade | G01R 35/005 |
| 2018/0180680 A1* | 6/2018 | Tagade | G08B 21/185 |
| 2018/0301922 A1* | 10/2018 | Battle | H02J 7/0072 |

FOREIGN PATENT DOCUMENTS

| | | |
|---|---|---|
| KR | 10-2014-0071060 A | 6/2014 |
| KR | 10-2015-0111961 A | 10/2015 |
| WO | WO 2014/114564 A1 | 7/2014 |

OTHER PUBLICATIONS

A.M. Bizeray, Lithium-ion battery thermal-electrochemical model-based state estimation using orthogonal collocation and a modified extended Kalman filter, Jun. 29, 2015, 32 pages. (Year: 2015).*

Paulo Kemper, Simplification of pseudo two dimensional battery model using dynamic profile of lithium concentration, Mar. 24, 2015, 17 pages (Year: 2015).*

Paul Wesley Clairday Northrop, Multiscale Modeling, Reformulation, and Efficient Simulation of Lithium-Ion Batteries, May 2014, 224 pages (Year: 2014).*

Paul W. C. Northrop, Efficient Simulation and Model Reformulation of Two-Dimensional Electrochemical Thermal Behavior of Lithium-Ion Batteries, Mar. 9, 2015, 13 pages (Year: 2015).*

* cited by examiner

METHOD OF DETERMINING STATE OF CHARGE OF BATTERY AND BATTERY MANAGING APPARATUS

CROSS-REFERENCE TO RELATED APPLICATION(S)

This application claims the benefit under 35 USC § 119 of Indian Provisional Application No. 201641018153 filed on May 26, 2016 in the Office of the Controller General of Patents, Designs & Trade Marks, Indian Patent Application No. 201641018153 filed on Dec. 28, 2016 in the Office of the Controller General of Patents, Designs & Trade Marks, and Korean Patent Application No. 10-2017-0040563 filed on Mar. 30, 2017 in the Korean Intellectual Property Office, the entire disclosures of which are incorporated herein by reference for all purposes.

BACKGROUND

1. Field

The following description relates to determining a state of charge (SOC) of a battery.

2. Description of Related Art

With increase in the use of products, such as, a mobile device including a smartphone, an electric vehicle (EV), and an energy storage system (ESS), the importance of efficiency in operating a secondary battery has increased. A lithium-ion battery has a higher energy density per unit weight and volume in comparison to other secondary batteries. Thus, research has been conducted to optimize a design and an operation of the lithium-ion battery.

A unit cell design and operation may be optimized by estimating an internal state and an immeasurable variable such as, for example, a state of health (SOH) and a degradation state of the lithium-ion battery using a measurable battery parameter. A battery managing device included in an electronic device may use a battery equivalent circuit model to estimate the battery parameter such as the immeasurable variable and the internal state.

An example of an equivalent circuit model is an electric equivalent circuit model (ECM), which is a scheme of analyzing a unit cell using a combination of a resistor and a capacitor to estimate a state of charge (SOC) and a degradation state. However, it is difficult to estimate immeasurable variables other than the SOC and the degradation state using the electric ECM.

A stochastic Pseudo 2-dimensional electrochemical thermal (P2D-ECT) model is an electrochemistry-based model that is capable of estimating variables including variables that the electric ECM finds difficult to estimate.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a method of estimating a state of charge (SOC) of a battery, the method including acquiring battery conservation equations based on a stochastic Pseudo 2-dimensional electrochemical thermal (P2D-ECT) model, calculating a stochastic reduced order model (SROM) and a mean using the battery conservation equations, combining state information of the battery measured by a sensor with the SROM and the mean, and determining the SOC of the battery based on a result of the combining.

The calculating may include calculating the SROM and the mean based on an SOC of the battery that is estimated based on the stochastic P2D-ECT model.

The determining may include updating a basis of Hermite polynomials based on a result of the combining, and determining the SOC of the battery by performing a basis conversion on the Hermite polynomials based on a result of the updating.

Each of the battery conservation equations may correspond to an equivalent battery conservation equation of the stochastic P2D-ECT model.

The acquiring may include acquiring a stochastic partial differential equation (SPDE) by acquiring a spectral expansion of a probability density function (PDF) of an SOC of the battery estimated using Hermite polynomials, and acquiring the battery conservation equations by performing a stochastic spectral projection on the SPDE.

The mean corresponds to a first battery conservation equation acquired based on the stochastic P2D-ECT model.

The SROM may be acquired by performing a volume averaging on the battery conservation equations, excluding the first battery conservation equation of the battery conservation equations.

The basis conversion may include changing coefficients of the SOC.

The stochastic P2D-ECT model may be acquired using Hermite polynomials, and each of the Hermite polynomials comprise a basis and a number of terms.

The state information may include state information associated any one or any combination of a voltage, a current, and a temperature of the battery.

The current SOC of the battery may include any one or any combination of a terminal voltage, a terminal current, a charging and discharging efficiency, an internal temperature, a charging rate, and a charge density.

In another general aspect, there is provided an apparatus for managing a battery, the apparatus including a processor configured to acquire battery conservation equations based on a stochastic Pseudo 2-dimensional electrochemical thermal (P2D-ECT) model, calculate a stochastic reduced order model (SROM) and a mean using the battery conservation equations, combine state information of the battery measured by a sensor with the SROM and the mean, and determine the state of charge (SOC) of the battery based on a result of the combining.

The processor may be configured to calculate the SROM and the mean based on an SOC of the battery that is estimated based on the stochastic P2D-ECT model.

The processor may be configured to update a basis of Hermite polynomials based on a result of the combining and to determine the SOC of the battery by performing a basis conversion on the Hermite polynomials based on a result of the updating.

Each of the battery conservation equations may correspond to an equivalent battery conservation equation of the stochastic P2D-ECT model.

The processor may be configured to acquire a stochastic partial differential equation (SPDE) by acquiring a spectral expansion of a probability density function (PDF) of an SOC of the battery estimated using Hermite polynomials, and to acquire the battery conservation equations by performing a stochastic spectral projection on the SPDE.

The mean may correspond to a first battery conservation equation acquired based on the stochastic P2D-ECT model.

The SROM may be acquired by performing a volume averaging on the battery conservation equations, excluding the first battery conservation equation of the battery conservation equations.

The basis conversion may include changing coefficients of the SOC.

Other features and aspects will be apparent from the following detailed description, the drawings, and the claims.

Figure 1A:
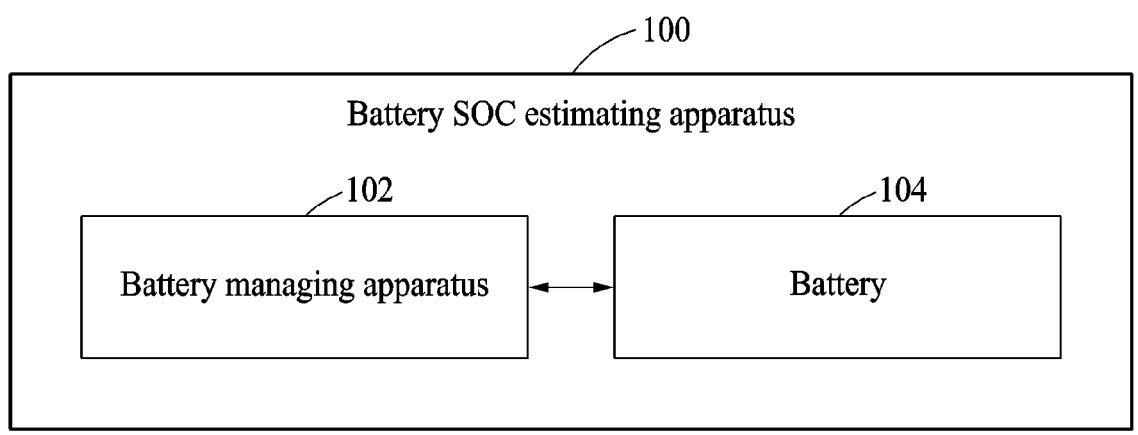
FIG. 1A is a diagram illustrating an example of an apparatus for estimating a state of charge (SOC) of a battery.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after gaining a thorough understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are known in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The following specific structural or functional descriptions are examples to merely describe embodiments, and various alterations and modifications may be made to the examples. Here, the examples are not construed as limited to the disclosure and should be understood to include all changes, equivalents, and replacements after gaining an understanding of the disclosure of this application.

Terms such as first, second, A, B, (a), (b), and the like may be used herein to describe components. Each of these terminologies is not used to define an essence, order or sequence of a corresponding component but used merely to distinguish the corresponding component from other component(s). For example, a first component may be referred to a second component, and similarly the second component may also be referred to as the first component.

It should be noted that if it is described in the specification that one component is "connected," "coupled," or "joined" to another component, a third component may be "connected," "coupled," and "joined" between the first and second components, although the first component may be directly connected, coupled or joined to the second component.

The terminology used herein is for the purpose of describing particular examples only, and is not to be used to limit the disclosure. As used herein, the terms "a," "an," and "the" are intended to include the plural forms as well, unless the context clearly indicates otherwise.

A function or an operation illustrated in a block may be performed not in a sequential order according to examples. For example, functions or operations illustrated in successive blocks may be actually performed concurrently, or an order of the blocks may be changed based on related functions or operations.

Figure 1B:
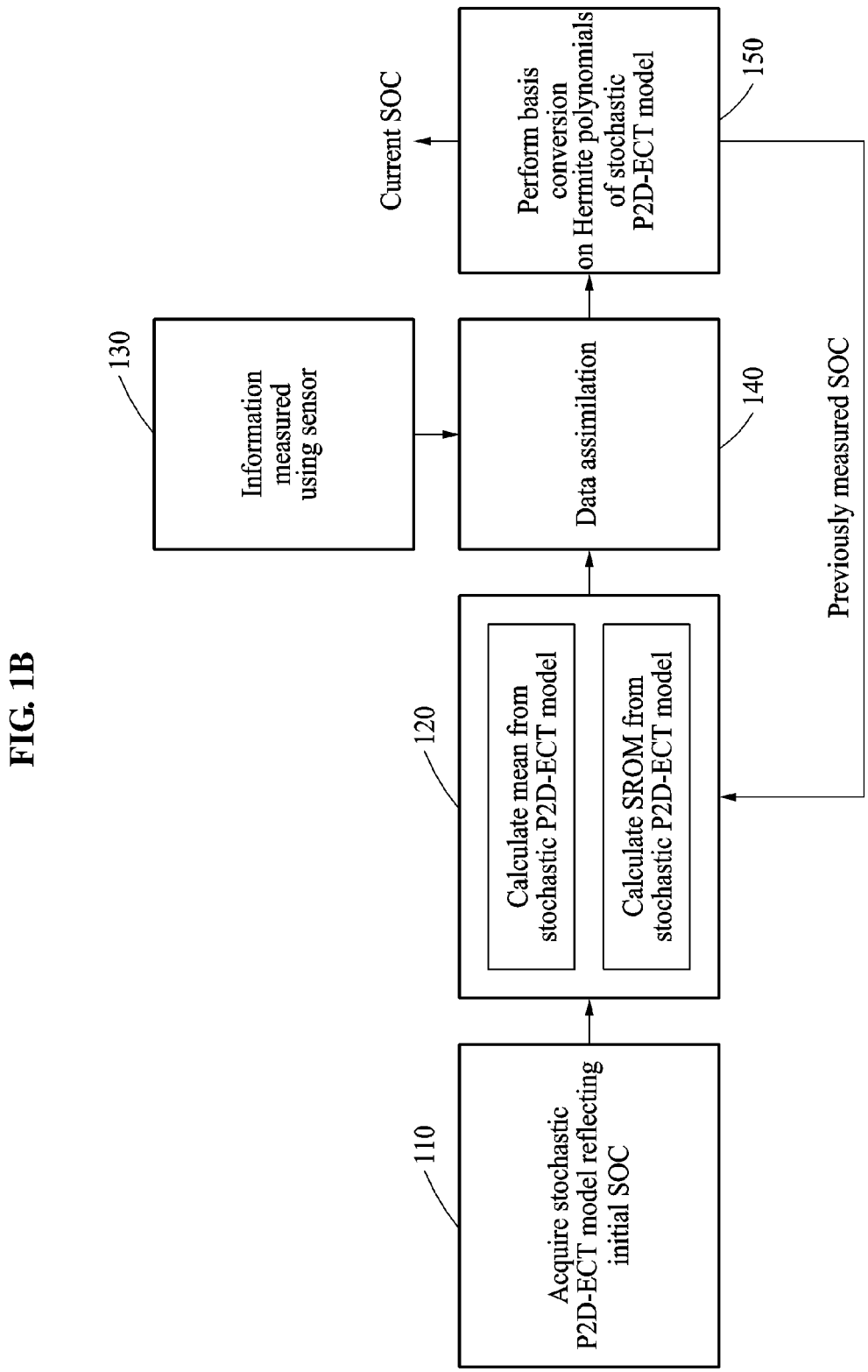
FIG. 1B illustrates an example of a battery SOC estimating method.

FIG. 1A is a diagram illustrating an example of an apparatus for determining a state of charge (SOC) of a battery. FIG. 1B illustrates an example of a battery SOC determining method. The operations in FIG. 1B may be performed in the sequence and manner as shown, although the order of some operations may be changed or some of the operations omitted without departing from the spirit and scope of the illustrative examples described. Many of the operations shown in FIG. 1B may be performed in parallel or concurrently. One or more blocks of FIG. 1B, and combinations of the blocks, can be implemented by special purpose hardware-based computer that perform the specified functions, or combinations of special purpose hardware and computer instructions. In addition to the description of FIG. 1B below, the descriptions of FIG. 1A is also applicable to FIG. 1B, and are incorporated herein by reference. Thus, the above description may not be repeated here.

Referring to FIG. 1A, a battery managing apparatus 102, for example, a battery management system (BMS) estimates an SOC of a battery 104 in real time. In other examples the SOC of the battery is estimated in near-real time, or with some built in latency. The battery managing apparatus 102 estimates unobservable variables or internal states of the battery 104 in real time based on observable state information of the battery 104 measured by a sensor. The battery managing apparatus 102 accurately estimates, tracks, or predicts the unobservable variables of the battery 104 by assimilating the measured state information with a pre-estimated SOC.

The unobservable state information includes state information associated with a attribute of the battery such as, for example, a voltage, a current, or a temperature of the battery 104. The unobservable variables include an SOC or a state of health (SOH). The SOC of the battery 104 includes at least one of a terminal voltage, a terminal current, a charging and discharging efficiency, an internal temperature, a charging rate, or a charge concentration of the battery 104.

The battery managing apparatus 102 acquires a number of battery conservation equations based on a stochastic spectral projection. The battery conservation equations are configured in a stochastic pseudo 2-dimensional electrochemical thermal (P2D-ECT) model. In an example, each of the battery conservation equations corresponds to an equivalent battery conservation equation of a P2D-ECT model.

The battery managing apparatus 102 calculates a stochastic reduced order model (SROM) and a mean using the number of battery conservation equations. The battery managing apparatus 102 calculates the SROM and the mean based on a pre-estimated SOC.

The battery managing apparatus 102 combines the SROM and the mean with the observable state information measured by a sensor. A basis update may be performed on a number of Hermite polynomials through a combination. IN an example, the battery managing apparatus 102 performs basis conversion on the number of Hermite polynomials using an updated basis to estimate the SOC of the battery 104.

A battery SOC determining apparatus 100 includes the battery managing apparatus 102 and the battery 104. In an example, the battery managing apparatus 102 is provided external to the battery 104 separately. The battery managing apparatus 102 may be included in an electric vehicle or an electric device such as a mobile phone or a laptop computer. A method of determining an SOC of the battery 104 is implemented by the battery managing apparatus 102. The method of determining the SOC of the battery 104 allows the battery managing apparatus 102 integrated with the battery SOC determining apparatus 100 to perform functions to estimate the SOC of the battery 104. The battery 104 includes, for example, a lithium-ion cell. In another example, the battery managing apparatus 102 is incorporated within the battery 104.

The battery managing apparatus 102 is applicable to an intelligent battery management required in an electric device an electric vehicle. The battery managing apparatus 102 intelligently responds to a user, a driver, or a pilot under different situations. For example, when an uncertainty exists with respect to a state of the battery 104 in a driverless electric vehicle, the battery managing apparatus 102 may assist an autonomous driving controller of the driverless electric vehicle to make an appropriate decision. The battery managing apparatus 102 estimates the unobservable variables of the battery 104 with a reliability greater than or equal to a threshold.

In an example, the electric vehicle satisfies a high output by using a battery pack including lithium-ion cells arranged in a serial-parallel structure. The battery managing apparatus 102 uses a sensor to monitor the lithium-ion cells or estimate the observable variables such as a voltage, a current, and a temperature. The sensor may be an on-board sensor and disposed in the battery 104. In an example, the battery managing apparatus 102 is disposed on-board the battery 104. In an example, the battery managing apparatus 102 estimates the unobservable variables and the internal state in real time by performing real-time data assimilation. The battery managing apparatus 102 consistently monitors the lithium-ions cells and estimates the unobservable variables such as, for example, an SOC and a degradation state of the battery 104, thereby ensuring a safe driving. As such, the battery managing apparatus 102 may solve a safety problem that may be caused due to a scaled-up battery pack configuration.

The battery managing apparatus 102 provides a framework that acquires state information or parameter information of the battery 104 such as a current, a voltage, and a temperature measured by the sensor. The battery managing apparatus 102 compares the acquired information to an SOC estimated at an early stage, and estimate a current SOC of the battery 104 based on a result of the comparison. The framework performs an online state estimation using a P2D-ECT model. In this example, a pre-estimated SOC is input to the P2D-ECT model as an input parameter.

The battery managing apparatus 102 estimates the SOC of the battery 104 based on the stochastic P2D-ECT model. The battery managing apparatus 102 acquires a mean and a SROM using the P2D-ECT model and performs the real-time data assimilation based on the observable state information of the battery 104. The battery managing apparatus 102 calculate the mean and the SROM based on the pre-estimated SOC. The battery managing apparatus 102 provides detailed stochastic information associated with the unobservable variables of the battery 104, which may be used by a controller of an autonomous/semiautonomous vehicle.

The battery managing apparatus 102 measures the observable state such as, for example, the voltage, the current, and the temperature of the battery 104 using the sensor, to estimate information on the internal state and the unobservable state of the battery 104 in real time. The battery managing apparatus 102 performs data assimilation that is efficient for calculation. In an example, the estimated SOC may be combined with information on observable parameters of the battery 104 so as to be used for determining the current SOC of the battery 104. The battery managing apparatus 102 is modifiable for a real-time implementation and economical in terms of calculation. For example, the battery managing apparatus 102 may be modified to be embedded on a board.

The battery managing apparatus 102 implements real-time battery management. The battery managing apparatus 102 acquires the P2D-ECT model through a stochastic spectral projection. The battery managing apparatus 102 performs an orthogonal basis transformation to provide a closed form solution for determining the current SOC of the battery 104. Thus, propagation of sigma-points or particles may not be needed as is needed in a data assimilation method.

The battery managing apparatus 102 provides stochastic information associated with the internal state such as, for example, a difference in potential between both ends of the battery 104, cathode and anode surface concentrations, an anode solid potential, an electrolyte concentration, an electrolyte potential of the battery 104. The battery managing apparatus 102 provides stochastic information of the unobservable variable such as an SOC of the battery 104. The stochastic information may be used in response to the battery managing apparatus 102 being integrated with a vehicle control system including a controller of an autonomous/semiautonomous vehicle. When the initial SOC is unknown, the battery managing apparatus 102 may accurately tracks the internal state of the battery 104 within 160 seconds from a time at which charging/discharging of the battery 104 starts. The battery managing apparatus 102 accurately predicts the internal state of the battery 104. The battery managing apparatus 102 may handle any change in speed at a load current related to an actual driving cycle. The battery managing apparatus 102 may compensate for a physical phenomenon which may be unexplainable in the P2D-ECT model.

Referring to FIG. 1B, the battery managing apparatus 102 estimates a current SOC of the battery 104. When a P2D-ECT is simplified or an estimated state is approximated to reduce a cost for a high dimension and a high calculation cost for the P2D-ECT model, an accuracy of the SOC may be reduced or internal state information may be lost. Instead of simplifying the P2D-ECT model or approximating the estimated state, the battery managing apparatus 102 performs periodical data assimilation using the stochastic P2D-ECT model, thereby determining a state of the battery 104 in real time at a low cost.

The battery managing apparatus 102 estimates the current SOC of the battery 104 based on a pre-estimated SOC acquired through feedback. The estimated current SOC functions as a pre-estimated SOC corresponding to an input parameter of an SOC to be estimated in a subsequent iteration. Due to an uncertainty of a sensor input and an initial SOC, the P2D-ECT model is stochastic. The battery managing apparatus 102 solves the stochastic characteristic of the estimated SOC through the stochastic spectral projection. For example, a solid phase charge conservation equation of the P2D-ECT model is as follow.

$$\frac{\partial}{\partial x}\left(-\sigma_s^{eff}\frac{\partial}{\partial x}\phi^s\right) = -a_s F j^{Li} \quad \text{[Equation 1]}$$

$$\phi^s = \sum_{i=1}^{P} \phi_i^s \psi_i(\xi) \quad \text{[Equation 2]}$$

$$J^{Li} = \sum_{i=1}^{P} j_i^{Li} \psi_i(\xi) \quad \text{[Equation 3]}$$

Using a solid potential spectral expansion and a Butler-Volmer reaction, that is, Equations 2 and 3, Equation 4 is obtained as follow.

$$\frac{\partial}{\partial x}\left(-\sigma_s^{eff}\frac{\partial}{\partial x}\sum_{i=1}^{P}\phi_i^s\psi_i(\xi)\right) = -a_s F \sum_{i=1}^{P} j_i^{Li}\psi_i(\xi) \quad \text{[Equation 4]}$$

Equation 4 is a combined partial differential equation and thus, difficult to be handled numerically. The stochastic spectral projection is used to divide such an equation. The stochastic spectral projection is used to divide terms of summation and generate P independent terms. Each of the terms expressed by the corresponding equations is shown in Equation 5 below. Here, k includes integers from 1 to P.

$$\frac{\partial}{\partial x}\left(-\sigma_s^{eff}\frac{\partial}{\partial x}\phi_k^s\right) = -a_s F j_k^{Li} \quad \text{[Equation 5]}$$

The P2D-ECT model is acquired through the foregoing process. The P2D-ECT model includes P battery conservation equations. As discussed below, each of the P battery conservation equations of the stochastic P2D-ECT model is structurally equivalent to the P2D-ECT model. Due to the structural equivalence, a solution of the stochastic P2D-ECT model is efficiently calculated.

In 110, the battery managing apparatus 102 acquires a stochastic P2D-ECT model reflecting an initial SOC. The battery managing apparatus 102 performs the spectral expansion on a probability density function (PDF) of the estimated SOC, for example, U0. A result of the spectral expansion is expressed using Equation 6 as below.

$$U_0 = \sum_{i=1}^{P} U_i \psi_i(\xi) \quad \text{[Equation 6]}$$

The PDF of the estimated SOC includes P coefficients, for example, U1, U2, . . . , UP. The spectral expansion is performed for each of the P coefficients of U0 using P Hermite polynomials, for example, $\Psi_1(\xi)$, $\Psi_2(\xi)$, . . . , $\Psi_p(\xi)$. The Hermite polynomials are orthogonal to one another in a Hilbert space. As a result of the spectral expansion, a stochastic partial differential equation (SPDE) is obtained. The SPDE is the same as Equation 4 in which $\phi_i^s$ is replaced by $U_i^s$. The stochastic spectral projection of the SPDE is performed on Equation 4 in which $\phi_i^s$ is replaced by and thus, P battery conservation equations are obtained with respect to the stochastic P2D-ECT model. The acquired P battery conservation equations are the same as Equation 5 in which $\phi_k^s$ replaced by $U_k^s$.

In 120, the battery managing apparatus 102 calculates a mean and an SROM from the stochastic P2D-ECT model. The mean and the SROM are calculated using the P battery conservation equations. The mean is based on a solution of a battery conservation equation of the stochastic P2D-ECT model corresponding to a first coefficient of an SOC, for example, k=1. The mean is obtained based on a numerical solution of the battery conservation equation of the stochastic P2D-ECT model corresponding to k=1. A calculation of the SROM is based on a solution of a battery conservation equation of the stochastic P2D-ECT model corresponding to a coefficient of the estimated SOC, for example, k>1. The SROM is obtained through a volume averaging of the battery conservation equation of the SROM corresponding to k>1 in a stochastic dimension.

In the stochastic dimension, the volume averaging uses a uniform uncertainty under a reaction rate assumption as shown by Equation 7.

$$j_k^{Li,n}(x,t) = \hat{j}_k^{Li,n}(t); k=2, \ldots, P \quad \text{[Equation 7]}$$

Each equation of the stochastic P2D-ECT model is equivalent to the P2D-ECT model. In an example, a current density is an input to a first coefficient of the estimated SOC, for example, the mean. Also, a current sensor error is an input of coefficients of estimated SOCs other than the first coefficient. In the used sensor, I2<0.111, and Ik is close to 0 with respect to k>2. Thus, with respect to k>1, solutions of equations of the stochastic P2D-ECT model are equivalent to a solution of a P2D-ECT model having a low C-rate. In terms of low C-rate operation, since the uniform reaction rate assumption is accurate, an approximation of the uniform uncertainty at a reaction rate for solving the stochastic P2D-ECT model is accurate.

In 130, the battery managing apparatus 102 measures observable state information such as, for example, a voltage, a current, and a temperature of the battery 104 using a sensor. In 140, the battery managing apparatus 102 provides a real-time estimation of an internal state and an unobservable variable of the battery 104 by assimilating a sensor-measured value of the observable state information of the battery 104. The battery managing apparatus 102 provides a data assimilation framework to propagate an uncertainty of a sensor input and an initial SOC. The data assimilation framework uses the P2D-ECT model to estimate the current SOC in real time. The data assimilation framework combines the SROM and the mean with the observable parameters of the battery 104. As a result of combination, a basis update is performed on the P Hermite polynomials.

In 150, the battery managing apparatus 102 performs basis conversion on the Hermite polynomials of the stochastic P2D-ECT model. The battery managing apparatus 102 acquires a closed solution for an updated basis. Thus, in an example, the propagations of sigma points or particles is also not being performed. The current SOC is acquired by performing the basis conversion. In an example, a coefficient of the estimated SOC is changed. The changed coefficient of the estimated SOC corresponds to the current SOC. The current SOC is used as a pre-estimated SOC to be combined with the mean and the SROM in a subsequent iteration. A battery management system estimates the unobservable variables and the internal state of the battery 104 at a high accuracy. When the SOC is unknown, the battery managing apparatus 102 may accurately track the SOC within a short time, for example, within 160 seconds from a start of charging/discharging of the battery 104.

Figure 2:
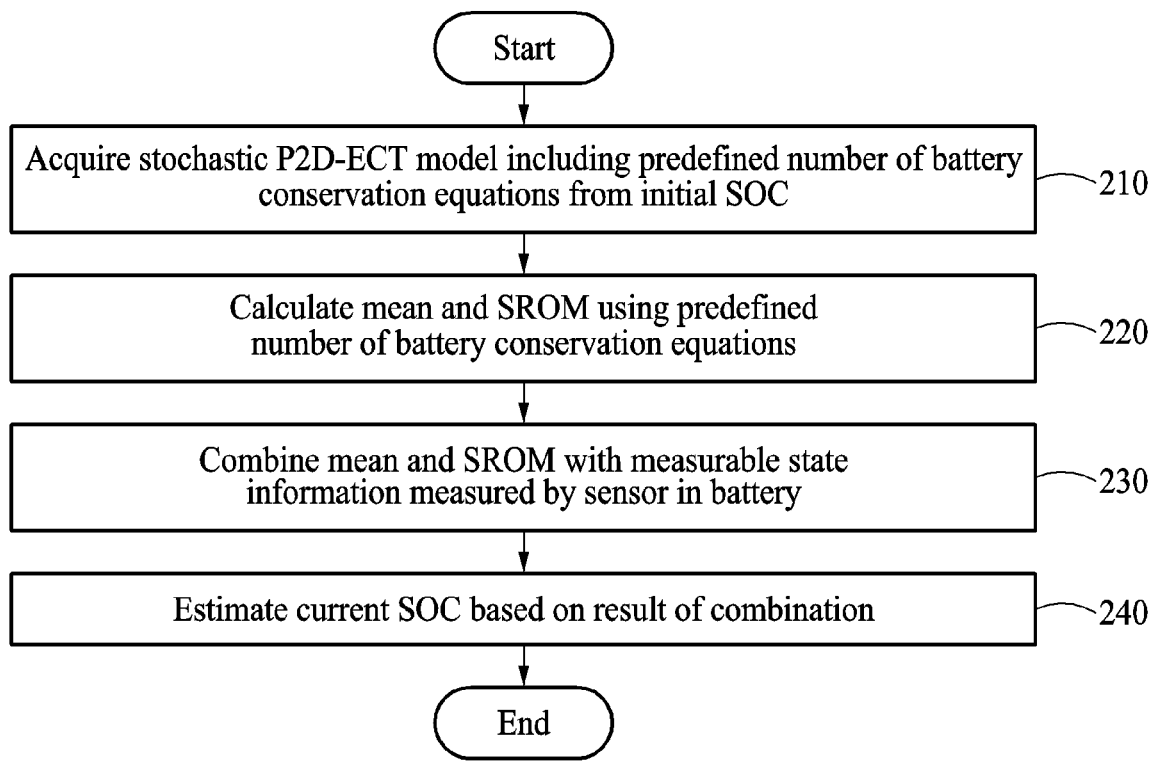
FIG. 2 is a diagram illustrating an example of a battery SOC estimating method.

FIG. 2 is a diagram illustrating an example of a battery SOC determining method. The operations in FIG. 2 may be performed in the sequence and manner as shown, although the order of some operations may be changed or some of the operations omitted without departing from the spirit and scope of the illustrative examples described. Many of the operations shown in FIG. 2 may be performed in parallel or concurrently. One or more blocks of FIG. 2, and combinations of the blocks, can be implemented by special purpose hardware-based computer that perform the specified functions, or combinations of special purpose hardware and computer instructions. In addition to the description of FIG. 2 below, the descriptions of FIGS. 1A-1B are also applicable to FIG. 2, and are incorporated herein by reference. Thus, the above description may not be repeated here.

In an example, the battery SOC determining method may be implemented in combination with any type of electrochemical thermal model for the battery 104.

In 210, the battery managing apparatus 102 acquires a number of battery conservation equations based on a stochastic P2D-ECT model. The battery managing apparatus 102 acquires the number of battery conservation equations through a stochastic spectral projection. The battery managing apparatus 102 acquires the stochastic P2D-ECT model including the number of battery conservation equations from an initial SOC. Each of the battery conservation equations corresponds to an equivalent battery conservation equation of the stochastic P2D-ECT model. The battery managing apparatus 102 acquires an SPDE by acquiring a spectral expansion of a PDF of an SOC estimated based on a number of Hermite polynomials. The battery managing apparatus 102 acquires the number of battery conservation equations by performing a stochastic spectral projection on the SPDE.

The estimated SOC includes a number of coefficients. The SPDE is acquired by performing the spectral expansion for each of the coefficients using the number of Hermite polynomials. In an example, the Hermite polynomials used for the spectral expansion are orthogonal to one another in a Hilbert space. Initially, an uncertainty may exist in an observable variable to be measured by a sensor of the battery managing apparatus 102 and the SOC. A partial differential equation, i.e., battery equations corresponding to the coefficients of the estimated SOC is expressed using the SPDE. The stochastic spectral expansion is performed on the SPDE, and then the battery conservation equations are acquired. The stochastic spectral projection is used to obtain a solution of the SPDE. Using the SPDE, a number of independent battery conservation equations are acquired. The battery conservation equations are included in the stochastic P2D-ECT model. When P is a number of the battery conservation equations, P may also be a number of terms of the spectral expansion. Each of the independent battery conservation equations is acquired using the stochastic spectral projection and are structurally similar to the P2D-ECT model.

In 220, the battery managing apparatus 102 calculates a mean and a SROM using the number of battery conservation equations. The battery managing apparatus 102 calculates the mean and the SROM based on the SOC of the battery 104 estimated using the stochastic P2D-ECT model. The battery managing apparatus 102 updates the number of battery conservation equations with a pre-estimated SOC. The battery managing apparatus 102 calculates the mean and the SROM using the battery conservation equations to which the pre-estimated SOC is applied. The stochastic P2D-ECT model is acquires based on Hermite polynomials. In an example, the Hermite polynomials include a basis and a number of terms.

The mean corresponds to a first battery conservation equation acquired using the stochastic P2D-ECT model. The battery managing apparatus 102 acquires the mean using the first battery conservation equation corresponding to a first term of the Hermit polynomial among the number of battery conservation equations. The SROM is acquired through a volume averaging performed on the battery conservation equations except for the first battery conservation equation. The battery managing apparatus 102 acquires the SROM by performing the volume averaging on remaining battery conservation equations excluding the first battery conservation equation from the number of battery conservation equations.

The SROM is calculated based on the SOC estimated using the stochastic P2D-ECT model. The mean corresponding to the first battery conservation equation of the stochastic P2D-ECT model is acquired using the P2D-ECT model. A battery conservation equation corresponding to a first coefficient, for example, k=1, provides an average of the SPDE. In contrast, a higher degree of coefficient of the estimated SOC, for example, k=2, . . . , P provides stochastic information. A SROM corresponding to a predetermined number of coefficients of the estimated SOC except for the first coefficient is acquired using a volume averaging battery conservation equation of "k=2, . . . , P" in a stochastic dimension. The volume averaging is applied to a higher coefficient of the estimated SOC for acquiring the SROM. A uniform uncertainty in a reaction speed is assumed to calculate the SROM. A simulation of a combined P2D-ECT SROM system is performed to acquire a solution of the stochastic P2D-ECT model.

In 230, the battery managing apparatus 102 combines the mean and the SROM with the state information of the battery 104 measured by a sensor. The battery managing apparatus 102 combines the mean and the SROM with information on the observable variables such as, for example, a voltage, a current, and a temperature of the battery 104. The observable variables are measured by a sensor included in the battery 104. The basis of the Hermite polynomials is updated as a result of combination. The battery managing apparatus 102 performs computationally efficient data assimilation by combining the estimated SOC with the observable variables of the battery 104. The battery SOC determining method may be embedded in the battery managing apparatus 102. The data assimilation may also be implemented on the P2D-ECT model.

In 240, the battery managing apparatus 102 estimates a current SOC of the battery 104 based on a result of combination. The battery managing apparatus 102 performs a basis update on the number of Hermite polynomials. The battery managing apparatus 102 performs basis conversion based on the result of combination. The battery managing apparatus 102 performs the basis conversion on the Hermite polynomials based on an update result to estimate a current SOC of the battery 104. The battery managing apparatus 102 estimates the current SOC using the stochastic P2D-ECT model corresponding to a converted basis. The basis conversion may indicate an operation of changing coefficients of the estimated current SOC.

The battery managing apparatus 102 performs the basis conversion on a number of Hermite polynomials based on the updated basis, thereby determining the SOC of the battery 104. The basis conversion may include an operation of changing coefficients of the estimated current SOC. The SOC having the changed coefficients may form a current or updated SOC. The current SOC of the P2D-ECT model is estimated by re-applying a basis updated for orthogonal Hermite polynomials. A closed solution is acquired with respect to the updated basis and thus, propagations of sigma points and particles may not be mandatorily performed. The battery managing apparatus 102 acquires the internal state and the unobservable variables of the battery 104 without a need to apply an additional approximation of the P2D-ECT model.

FIGS. 3A through 3D are diagrams illustrating examples of an accuracy of a battery voltage, an accuracy of a cathode surface concentration, an accuracy of an anode surface concentration, and accuracies of an anode surface potential, and a cathode surface potential among battery internal states estimated at room temperature based on a battery SOC determining method. In the following drawings FIGS, a solid line represents an actual SOC, a dashed line represents the result obtained by the battery managing apparatus 102, and a dash-dot line represents the result obtained by using the P2D-ECT model.

Figure 3A:
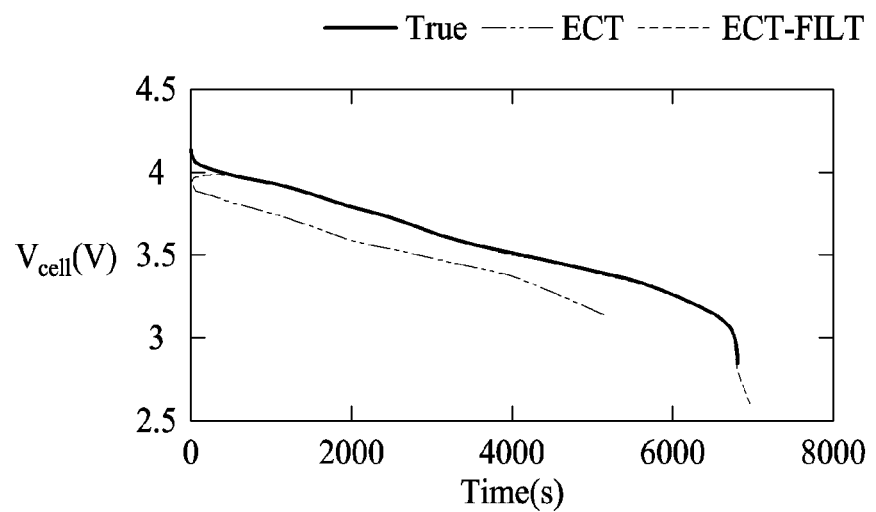
FIG. 3A is a diagram illustrating an example of an accuracy of a battery voltage among battery internal states estimated at room temperature based on a battery SOC estimating method.
Figure 3B:
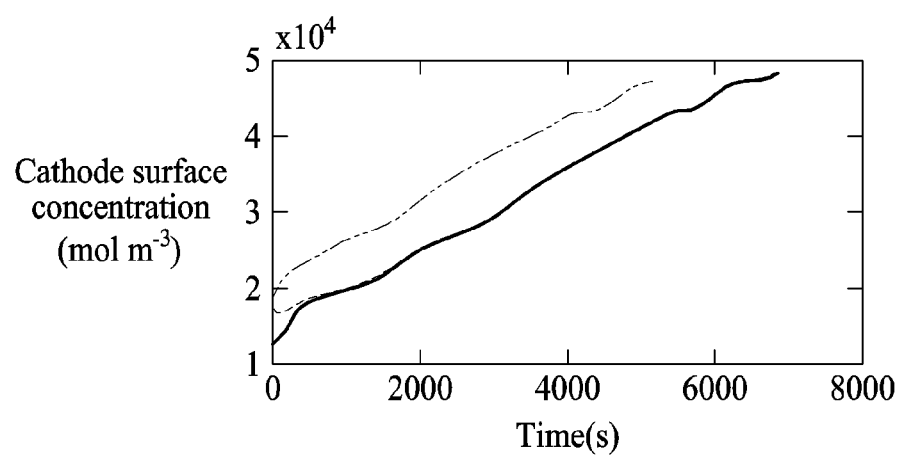
FIG. 3B is a diagram illustrating an example of an accuracy of a cathode surface concentration among battery internal states estimated at room temperature based on a battery SOC estimating method.
Figure 3C:
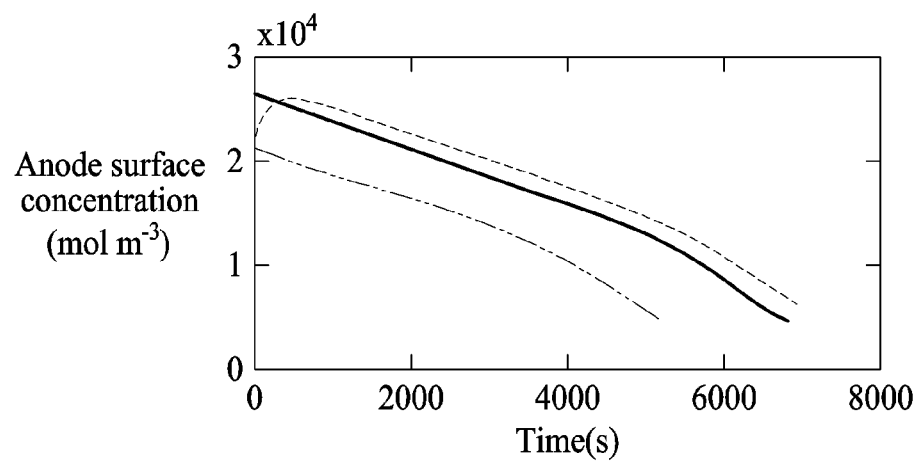
FIG. 3C is a diagram illustrating an example of an accuracy of an anode surface concentration among battery internal states estimated at room temperature based on a battery SOC estimating method.
Figure 3D:
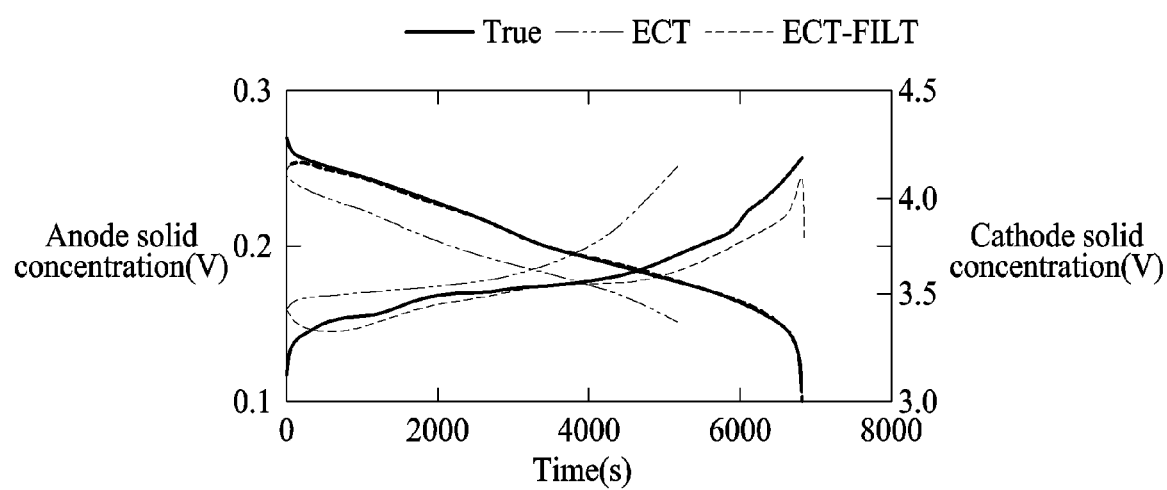
FIG. 3D is a diagram illustrating accuracies of an anode surface potential and a cathode surface potential among battery internal states estimated at room temperature based on a battery SOC estimating method.
Figure 4A:
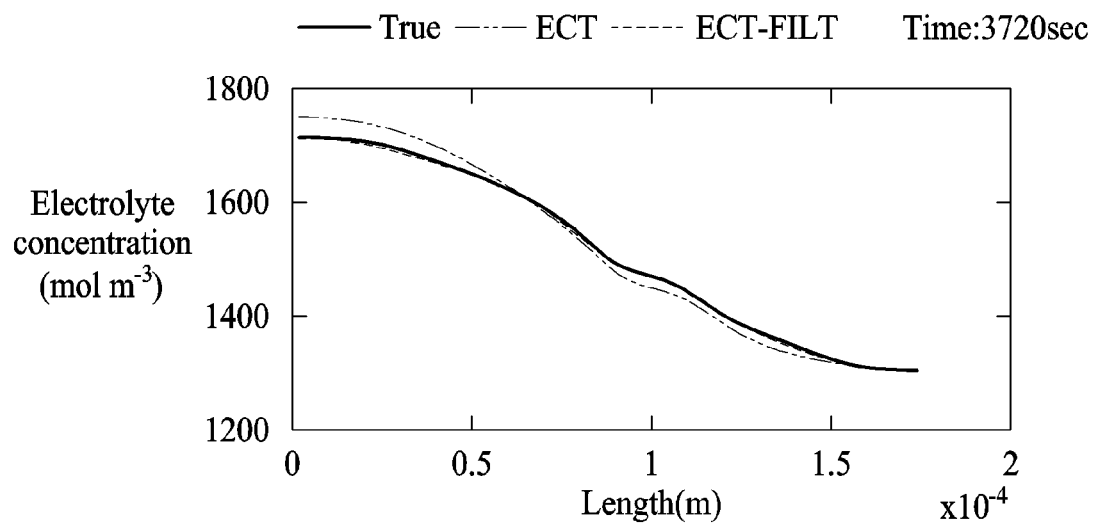
FIG. 4A is a diagram illustrating an example of a battery electrolyte concentration relative to a length at room temperature among battery internal states estimated based on a battery SOC estimating method.
Figure 4B:
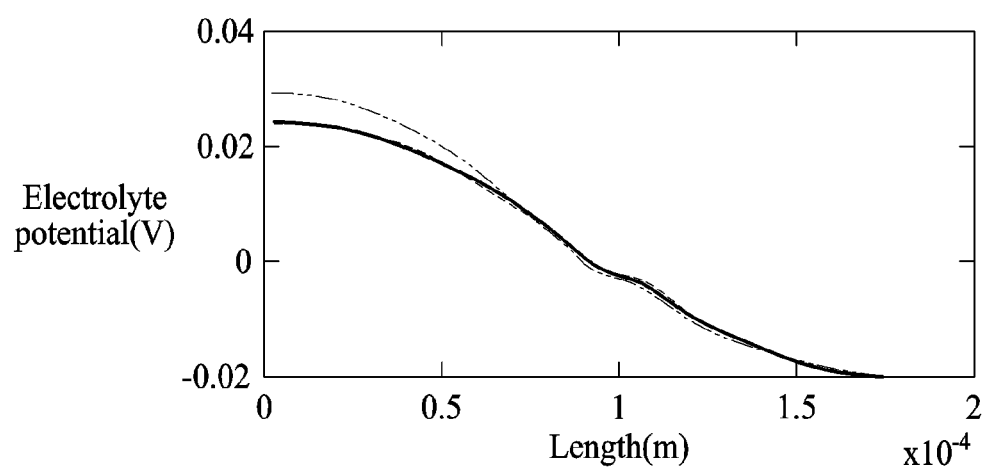
FIG. 4B is a diagram illustrating an example of a battery electrolyte potential relative to a length at room temperature among battery internal states estimated based on a battery SOC estimating method.
Figure 4C:
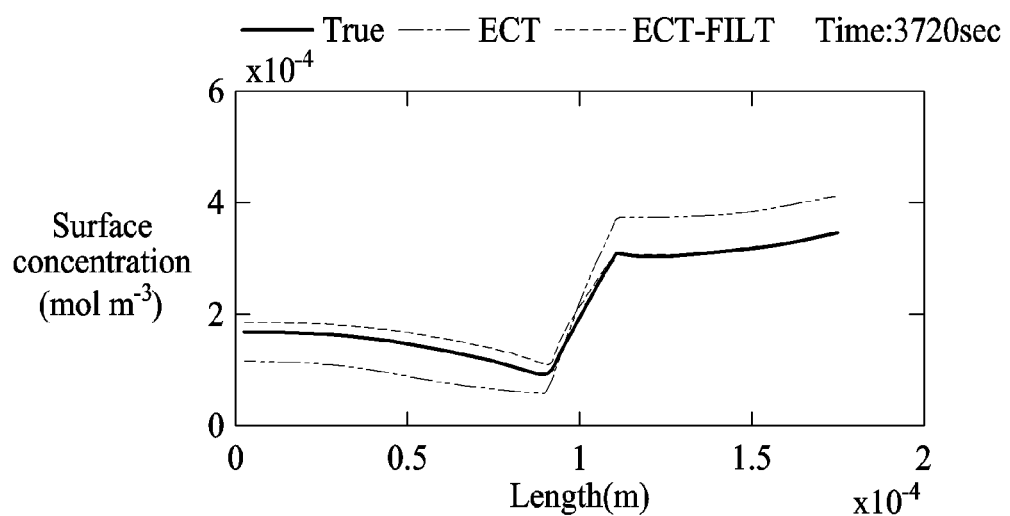
FIG. 4C is a diagram illustrating a battery surface concentration relative to a length at room temperature among battery internal states estimated based on a battery SOC estimating method.
Figure 4D:
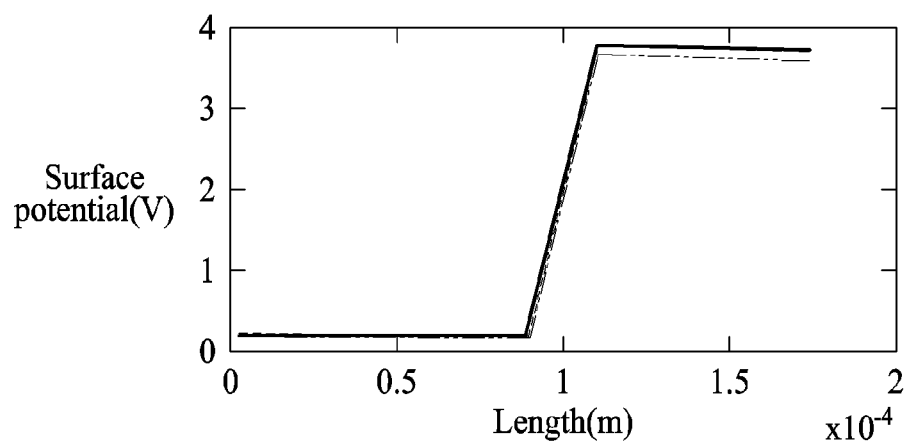
FIG. 4D is a diagram illustrating an example of a battery surface potential relative to a length at room temperature among battery internal states estimated based on a battery SOC estimating method.
Figure 5A:
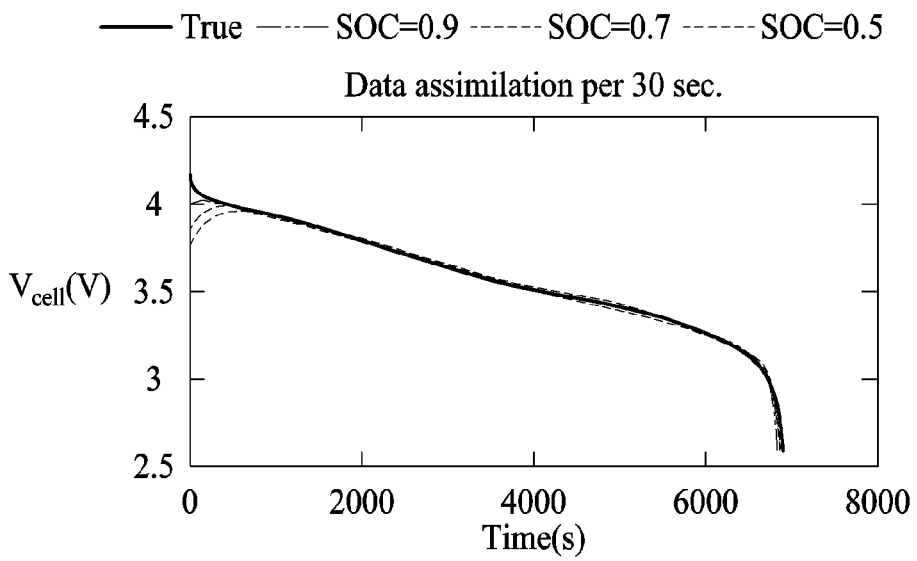
FIG. 5A is a diagram illustrating an example of an accuracy of a voltage among battery internal states tracked from different SOCs based on a battery SOC estimating method.
Figure 5B:
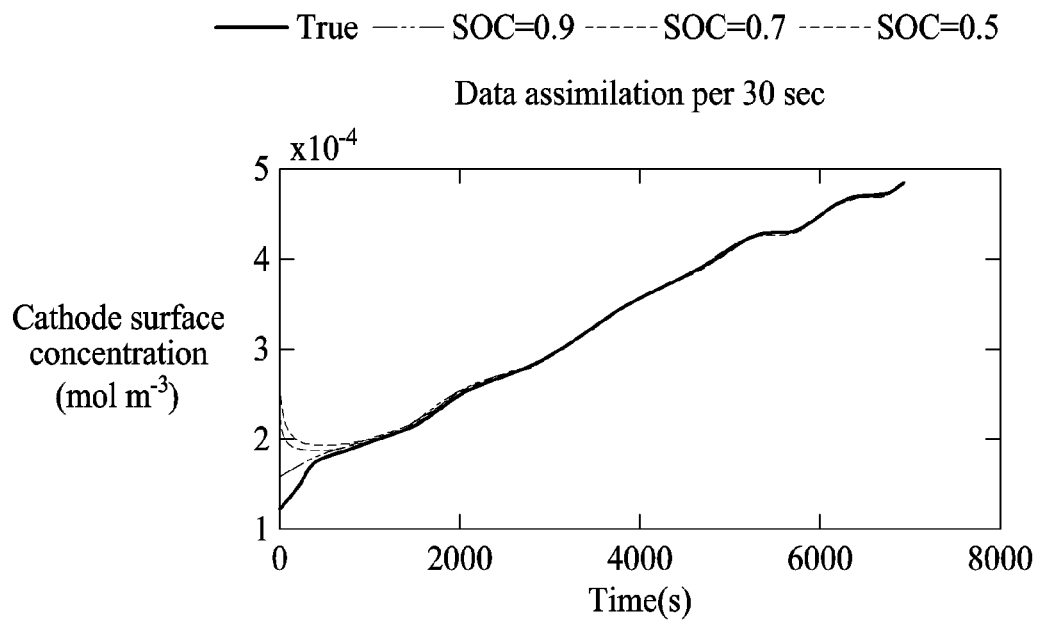
FIG. 5B is a diagram illustrating an example of an accuracy of a cathode surface concentration among battery internal states tracked from different SOCs based on a battery SOC estimating method.
Figure 5C:
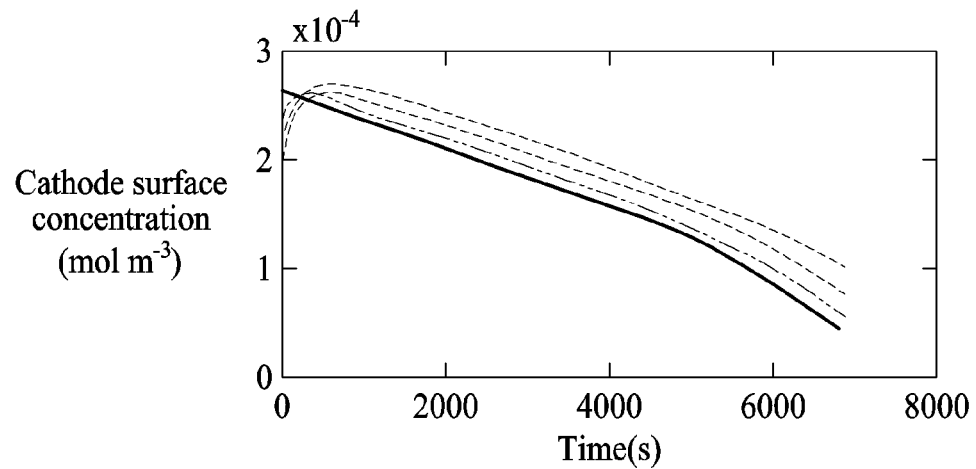
FIG. 5C is a diagram illustrating an example of an accuracy of an anode surface concentration among battery internal states tracked from different SOCs based on a battery SOC estimating method.
Figure 5D:
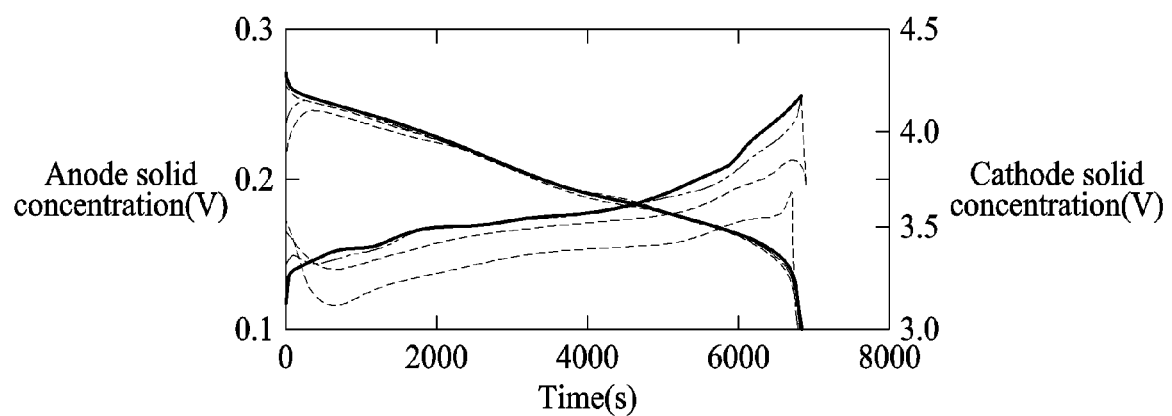
FIG. 5D is a diagram illustrating an example of accuracies of an anode surface potential and a cathode surface potential among battery internal states tracked from different SOCs based on a battery SOC estimating method.

Referring to FIGS. 3A through 3D, at a time of zero seconds, an initial SOC is inaccurate. When data such as an observable variable and an internal state is assimilated at intervals of 30 seconds, the battery managing apparatus 102 may track an accurate voltage of the battery 104 within about 160 seconds. In FIG. 3A, ECT denotes a result obtained by using a P2D-ECT model without changing and ECT-FILT denotes a result obtained by the battery managing apparatus 102. As shown in the drawings, the result obtained by the battery managing apparatus 102 is more accurate than the result obtained by using the P2D-ECT model. Similarly, to a cell voltage illustrated in FIG. 3A, in FIG. 3B, a cathode surface concentration, which is not to be measured by a sensor, may be accurately tracked. Likewise, FIG. 3C illustrates a comparison result of an anode surface concentration. An accuracy on tracking the anode surface concentration is relatively low when compared to other SOCs. This indicates lower information contents at a cell voltage with respect to the anode surface concentration. FIG. 3D illustrates a result of comparison between anode and cathode current connecting ends.

FIGS. 4A through 4D are diagrams respectively illustrating examples of a battery electrolyte concentration, a battery electrolyte potential, a battery surface concentration, and a battery surface potential relative to a length at room temperature among battery internal states estimated based on a battery SOC determining method. FIGS. 4A through 4D illustrate SOCs at a time of 3720 seconds based on a length of the battery 104. The battery managing apparatus 102 estimates an internal state of the battery 104 by performing assimilation on an observable variable such as a voltage, a current, and a temperature. The battery managing apparatus 102 accurately tracks the internal state of the battery 104. An accurate tracking result of the internal state of the battery 104 may be used by the battery managing apparatus 102 for battery monitoring to complement inaccurate diagnosis and prediction.

FIGS. 5A through 5D are diagrams respectively illustrating examples of an accuracy of a voltage, an accuracy of a cathode surface concentration, an accuracy of an anode surface concentration, and accuracies of an anode surface potential and a cathode surface potential among battery internal states tracked from different SOCs based on a battery SOC determining method. Referring to FIGS. 5A through 5D, even when an SOC starts from 0.5 that is an inaccurate SOC, the battery managing apparatus 102 may track an internal state and other parameters of the battery 104 at a high accuracy. A desired accuracy may be achieved irrespective of a size of an error in an estimated SOC. Furthermore, a time required for an accurate tracking may not be affected by the error in the estimated SOC.

Figure 6A:
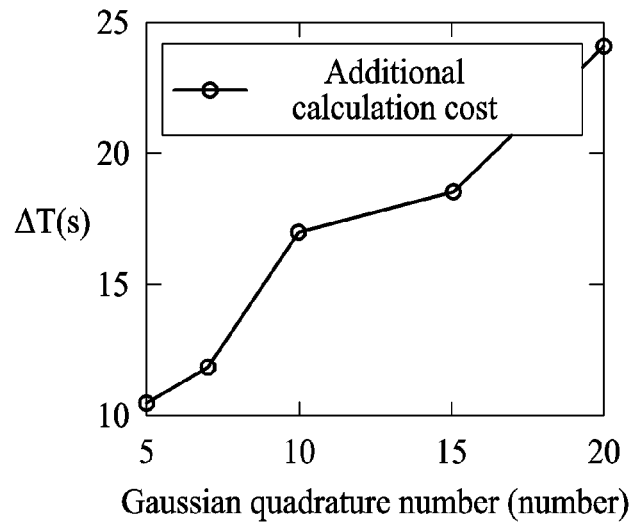
FIG. 6A is a diagram illustrating an example of a change in Gaussian quadrature number with respect to a change in additional calculation cost based on a battery SOC estimating method.
Figure 6B:
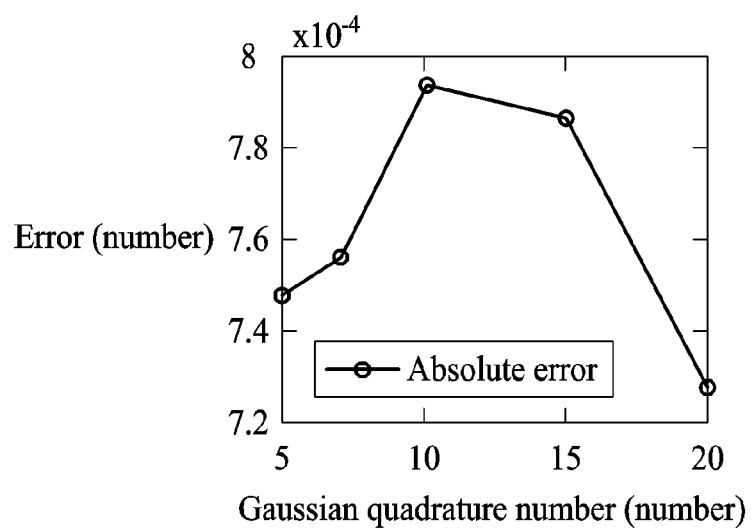
FIG. 6B is a diagram illustrating an example of a change in Gaussian quadrature number with respect to a change in absolute error based on a battery SOC estimating method.
Figure 6C:
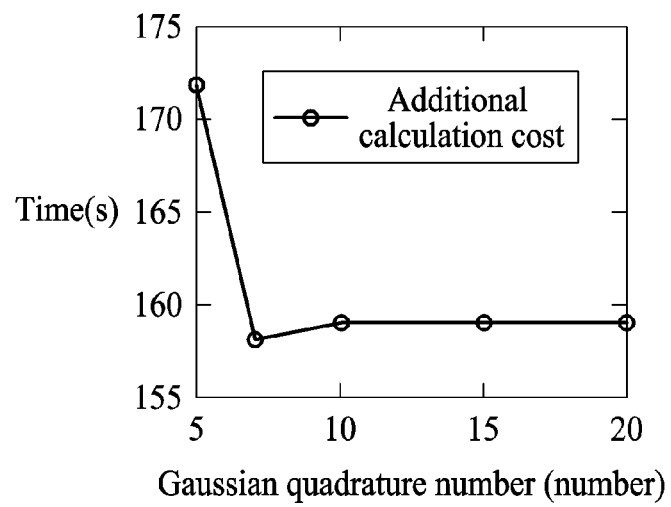
FIG. 6C is a diagram illustrating an example of a change in Gaussian quadrature number with respect to a change in time used for tracking based on a battery SOC estimating method in accordance with an embodiment.

FIG. 6A is a diagram illustrating an example of a change in Gaussian quadrature number with respect to a change in additional calculation cost based on a battery SOC determining method. FIG. 6B is a diagram illustrating an example of a change in Gaussian quadrature number with respect to a change in absolute error based on a battery SOC determining method. FIG. 6C is a diagram illustrating an example of a change in Gaussian quadrature number with respect to a change in time used for tracking based on a battery SOC determining method.

Referring to FIG. 6A, when an assimilation frequency is 30 seconds, a discharging rate is 0.5 C, and a calculation time is 7200 seconds, the battery managing apparatus 102 tracks an SOC using an additional cost less than 25 seconds in terms of the time used for tracking. Referring to FIG. 6C, the battery managing apparatus 102 tracks a voltage of the battery 104 within 160 seconds, starting from a time at which discharging of the battery 104 starts.

Figure 6D:
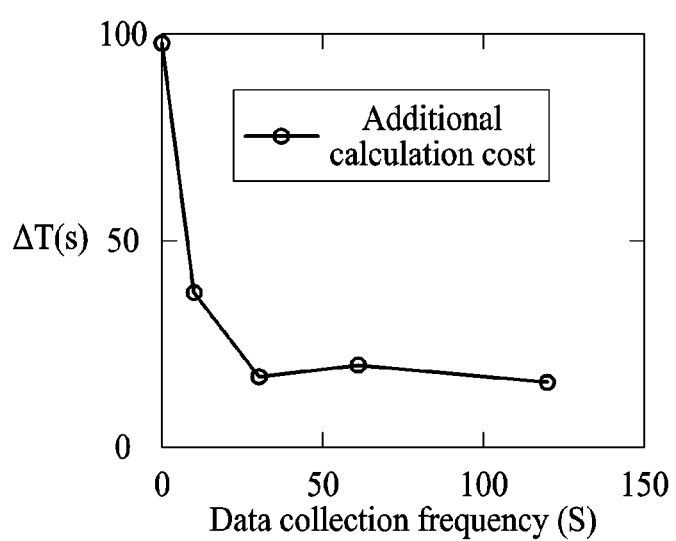
FIG. 6D is a diagram illustrating an example of a change in frequency of collecting data associated with observable variables for an additional calculation cost based on a battery SOC estimating method.
Figure 6E:
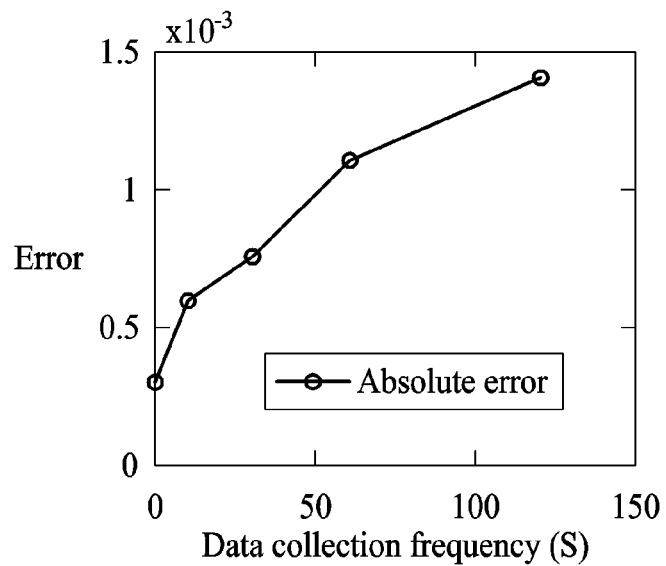
FIG. 6E is a diagram illustrating an example of a change in frequency of collecting data associated with observable variables for an absolute error based on a battery SOC estimating method.
Figure 6F:
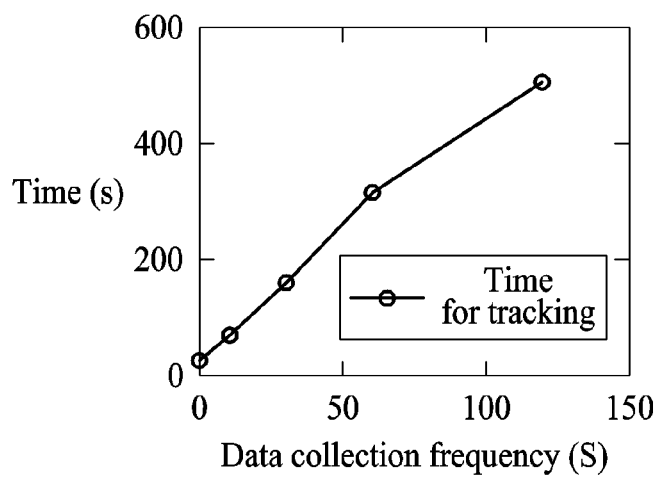
FIG. 6F is a diagram illustrating an example of a change in frequency of collecting data associated with observable variables for a time used for tracking based on a battery SOC estimating method.

FIG. 6D is a diagram illustrating an example of a change in frequency of collecting data associated with observable variables for an additional calculation cost based on a battery SOC determining method. FIG. 6E is a diagram illustrating an example of a change in frequency of collecting data associated with observable variables for an absolute error based on a battery SOC determining method. FIG. 6F is a diagram illustrating an example of a change in frequency of collecting data associated with observable variables for a time used for tracking based on a battery SOC determining method.

Referring to FIGS. 6D through 6F, the battery managing apparatus 102 may achieve a high assimilation frequency, for example, one second, using an additional calculation cost of about 100 seconds.

Figure 7A:
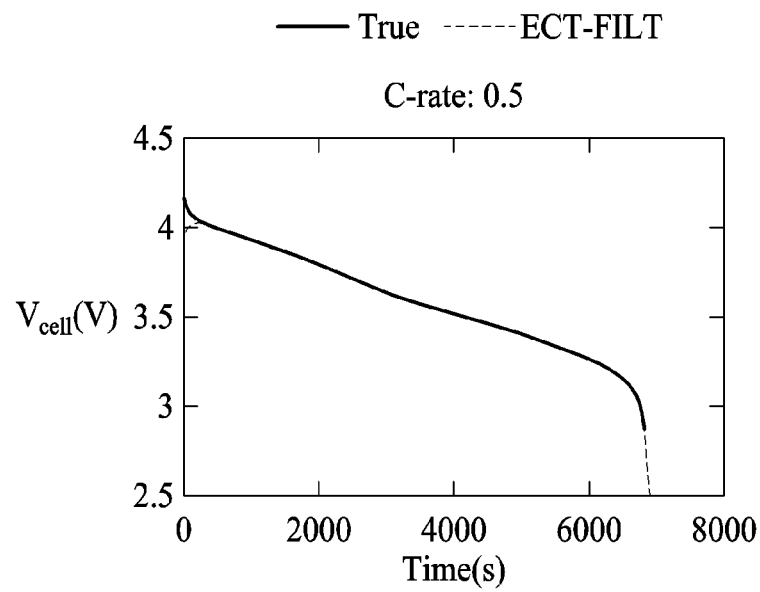
FIG. 7A is a diagram illustrating an example of a change in voltage of a battery over time based on a method of estimating an SOC of a battery in a case in which a C-rate is 0.5.
Figure 7B:
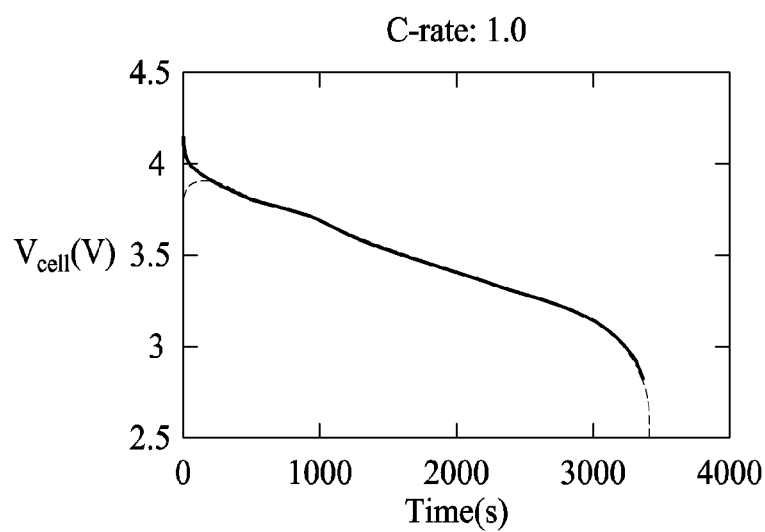
FIG. 7B is a diagram illustrating an example of a change in voltage of a battery over time based on a method of estimating an SOC of a battery in a case in which a C-rate is 1.0.
Figure 7C:
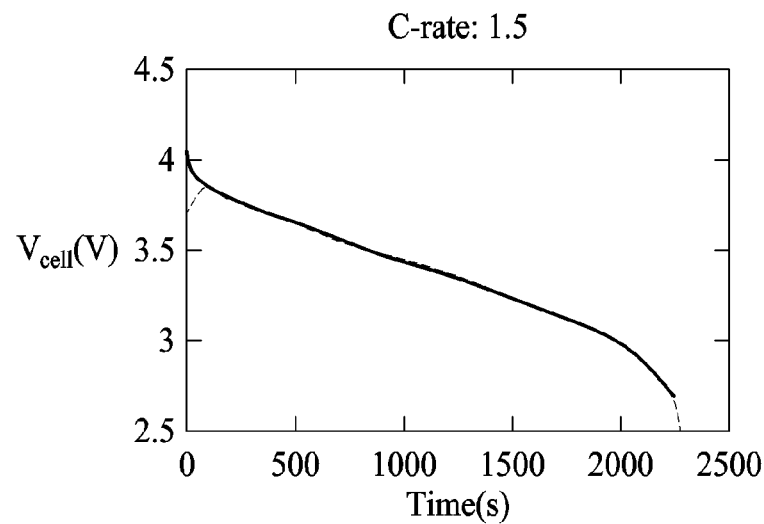
FIG. 7C is a diagram illustrating an example of a change in voltage of a battery over time based on a method of estimating an SOC of a battery in a case in which a C-rate is 1.5.
Figure 7D:
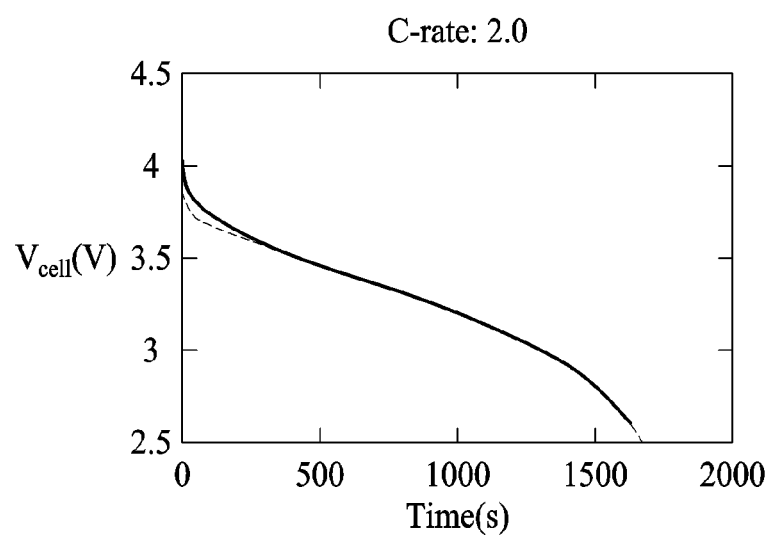
FIG. 7D is a diagram illustrating an example of a change in voltage of a battery over time based on a method of estimating an SOC of a battery in a case in which a C-rate is 2.0 in accordance with an embodiment.
Figure 7E:
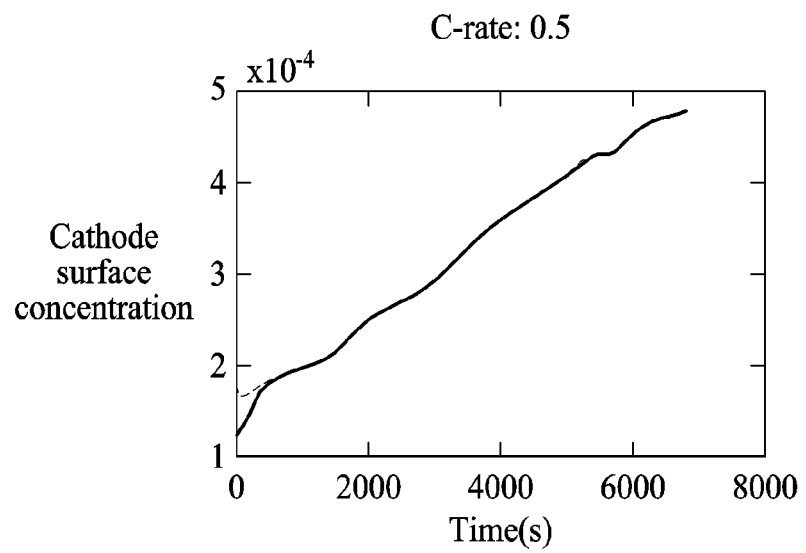
FIG. 7E is a diagram illustrating an example of a change in cathode surface concentration over time based on a method of estimating an SOC of a battery in a case in which a C-rate is 0.5.
Figure 7F:
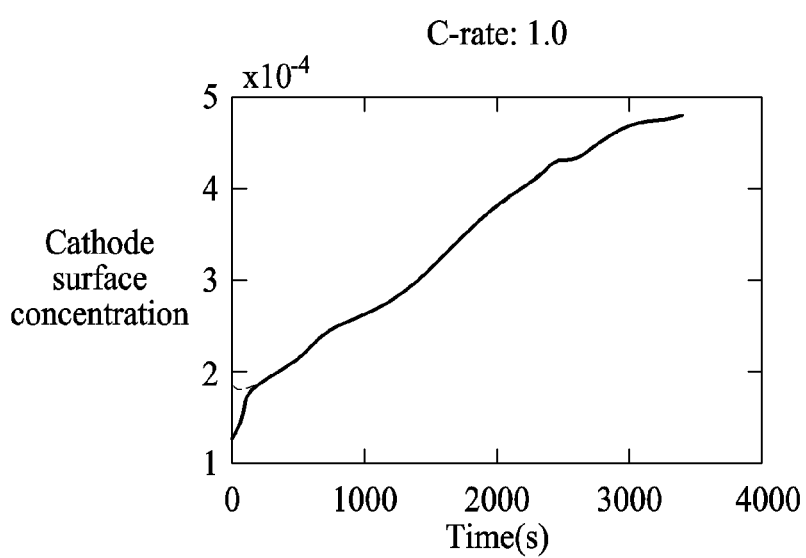
FIG. 7F is a diagram illustrating an example of a change in cathode surface concentration over time based on a method of estimating an SOC of a battery in a case in which a C-rate is 1.0.
Figure 7G:
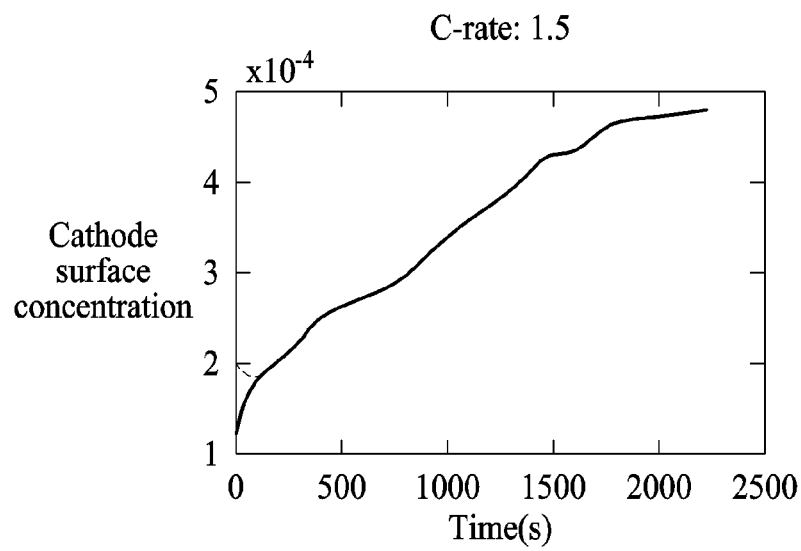
FIG. 7G is a diagram illustrating an example of a change in cathode surface concentration over time based on a method of estimating an SOC of a battery in a case in which a C-rate is 1.5.
Figure 7H:
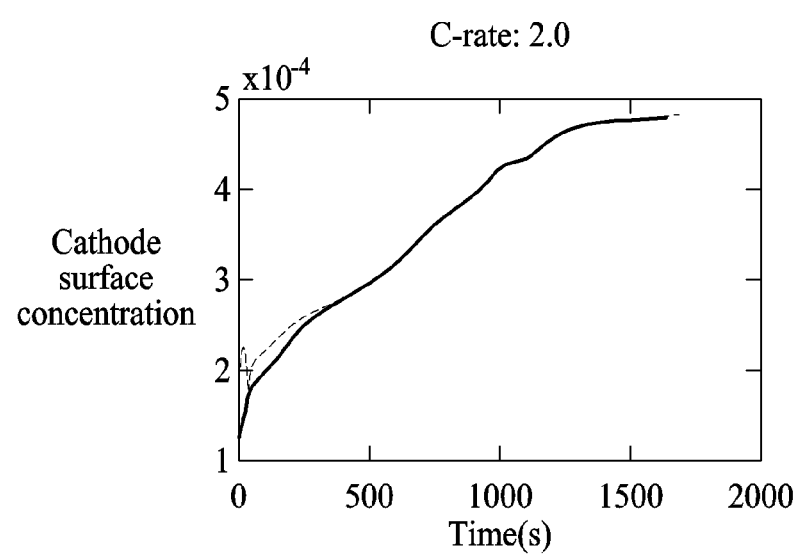
FIG. 7H is a diagram illustrating an example of a change in cathode surface concentration over time based on a method of estimating an SOC of a battery in a case in which a C-rate is 2.0.

FIG. 7A is a diagram illustrating an example of a change in voltage of a battery over time based on a method of determining an SOC of a battery in a case in which a C-rate is 0.5. FIG. 7B is a diagram illustrating an example of a change in voltage of a battery over time based on a method of determining an SOC of a battery in a case in which a C-rate is 1.0. FIG. 7C is a diagram illustrating an example of a change in voltage of a battery over time based on a method of determining an SOC of a battery in a case in which a C-rate is 1.5. FIG. 7D is a diagram illustrating an example of a change in voltage of a battery over time based on a method of determining an SOC of a battery in a case in which a C-rate is 2.0. FIGS. 7E through 7H are diagrams respectively illustrating a change in cathode surface concentration over time based on a method of determining an SOC of a battery when a C-rate is 0.5, 1.0, 1.5, and 2.0. FIGS. 7A through 7G illustrate results obtained by determining a cathode surface concentration and a voltage of the battery 104 at different C-rates using the battery managing apparatus 102. Here, an assimilation frequency is 30 seconds with respect to all of the C-rates. With respect to all of the C-rates, the voltage is tracked within 160 seconds from a time at which a discharging of the battery 104 starts. The battery managing apparatus 102 accurately tracks the cathode surface concentration with respect to all of the C-rates. Accordingly, an accuracy of a filter has a characteristic that does not vary according to a C-rate.

Figure 8A:
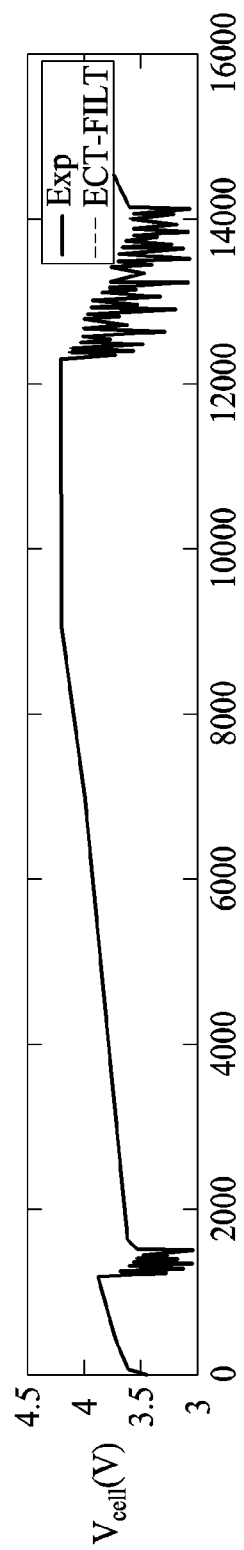
FIG. 8A is a diagram illustrating an example of a result of comparison between a battery voltage acquired using an experimental method and a battery voltage estimated based on a battery SOC estimating method at a scale in units of 10000 seconds.
Figure 8B:
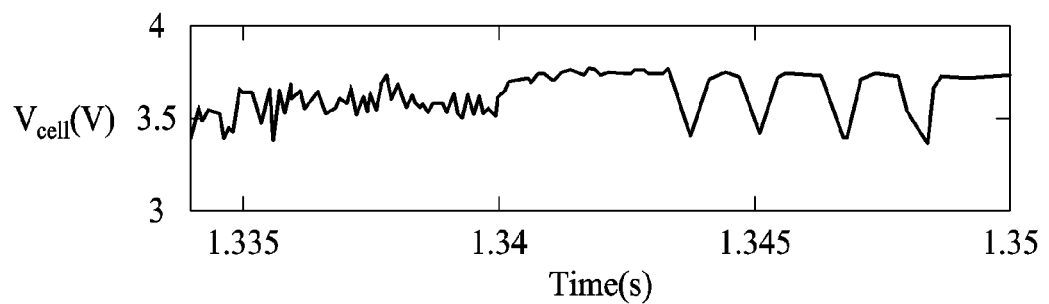
FIG. 8B is a diagram illustrating an example of a result of comparison between a battery voltage acquired using an experimental method and a battery voltage estimated based on a battery SOC estimating method at a scale in units of 0.01 seconds.
Figure 8C:
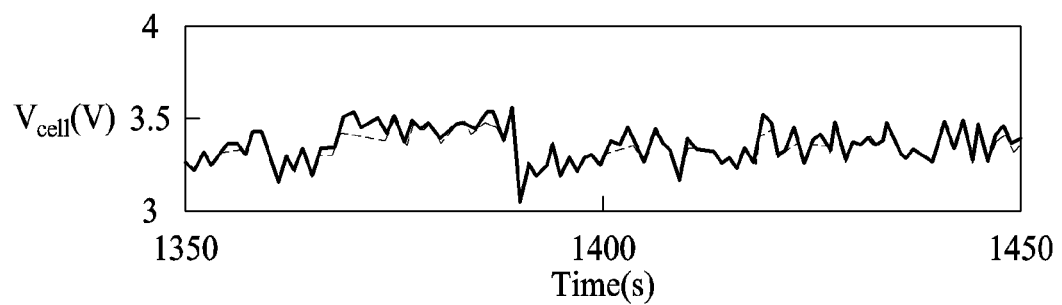
FIG. 8C is a diagram illustrating an example of a result of comparison between a battery voltage acquired using an experimental method and a battery voltage estimated based on a battery SOC estimating method at a scale in units of 100 seconds.
Figure 8D:
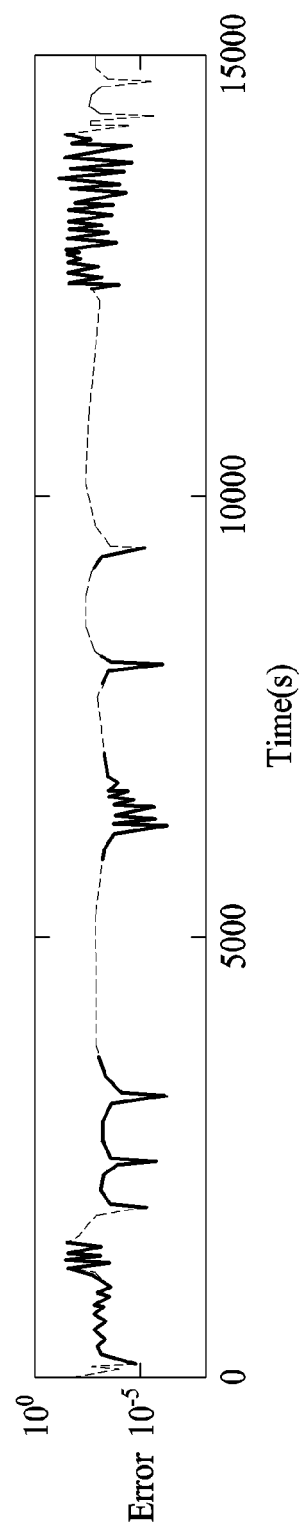
FIG. 8D is a diagram illustrating an example of a result of comparison between errors in measured values of a battery voltage acquired using an experimental method and a battery voltage estimated based on a battery SOC estimating method.

FIG. 8A is a diagram illustrating an example of a result of comparison between a battery voltage acquired using an experimental method and a battery voltage estimated based on a battery SOC determining method at a scale in units of 10000 seconds. FIG. 8B is a diagram illustrating an example of a result of comparison between a battery voltage acquired using an experimental method and a battery voltage estimated based on a battery SOC determining method at a scale in units of 0.01 seconds. FIG. 8C is a diagram illustrating an example of a result of comparison between a battery voltage acquired using an experimental method and a battery voltage estimated based on a battery SOC determining method at a scale in units of 100 seconds. FIG. 8D is a diagram illustrating an example of a result of comparison between errors in measured values of a battery voltage acquired using an experimental method and a battery voltage estimated based on a battery SOC determining method.

FIGS. 8A through 8C illustrate a result of comparison between voltages of the battery 104 acquired using an experimental method and a battery SOC determining method. As to a US06-UDDS driving cycle corresponding to a standard test of the battery 104 in an electric vehicle under a condition of city driving, results of acquiring a voltage of the battery 104 are illustrated in FIGS. 8A through 8C. The results show that the battery SOC determining method achieves a high accuracy under a situation in which a variable input current is present.

FIG. 8D illustrates a result of comparison between errors in measured values of a voltage of the battery 104 acquired using an experimental method and a voltage of the battery 104 estimated based on a battery SOC determining method. When the battery SOC determining, method is used, a maximum absolute error in estimation or prediction may be about 0.17 V.

Figure 9:
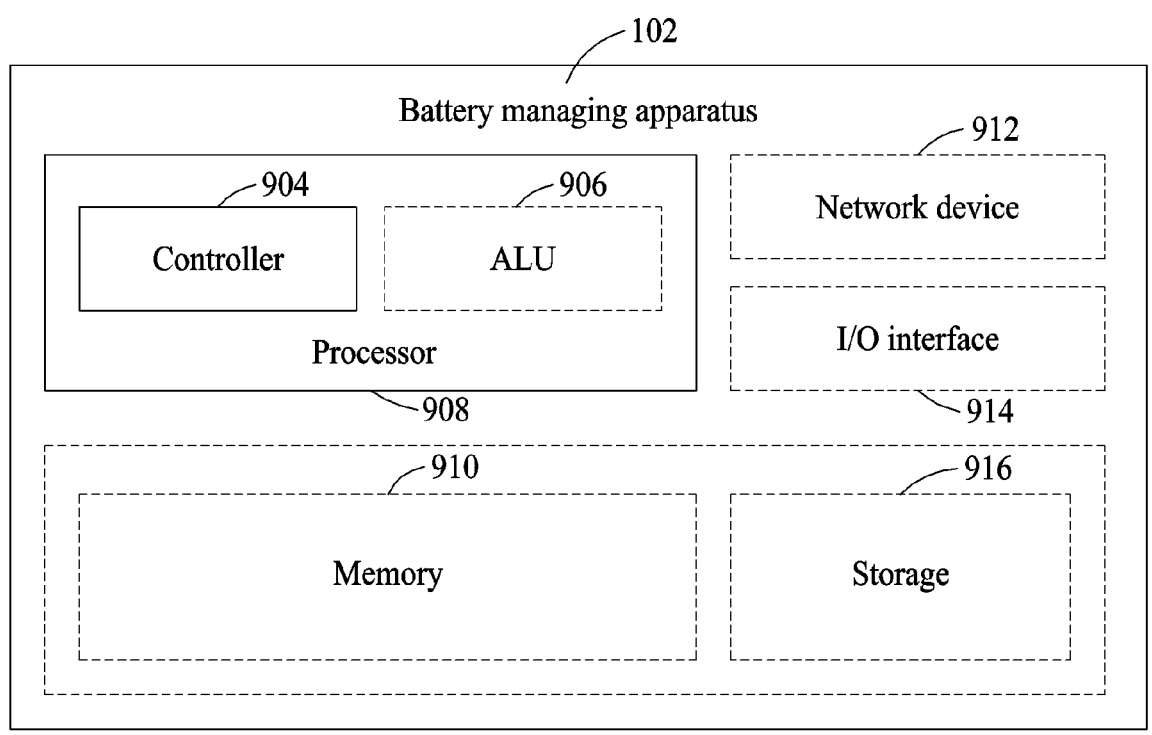
FIG. 9 is a diagram illustrating an example of a battery managing apparatus performing a battery SOC estimating method.

FIG. 9 is a diagram illustrating an example of a battery managing apparatus performing a battery SOC determining method.

Referring to FIG. 9, the battery managing apparatus 102 includes at least one processor 908 including a controller 904. The processor 908 includes an arithmetic logic unit (ALU) 906. The battery managing apparatus 102 includes a memory 910, a network device 912, an I/O interface 914, or a storage 916. The processor 908 processes instructions to perform a method. The processor 908 receives a command from the controller 904 to process the instructions. The ALU 906 performs a logical operation and an arithmetic operation while the instructions are executed.

In an example, the battery managing apparatus 102 includes a plurality of cores, a plurality of different central processing units (CPUs), a special media, and different accelerators. The processor 908 processes the instructions. When a plurality of processors 908 is provided, the processors 908 are arranged on a single chip or a plurality of chips.

Codes and instructions required to implement the foregoing examples are stored in the memory 910 or the storage 916. The instructions are imported from the memory 910 or the storage 916 to be executed by the processor 908. Also, various types of the network device 912 and the I/O interface 914 are connectable with the battery managing apparatus 102.

The battery managing apparatus 102, battery management system, and other apparatuses, units, modules, devices, and other components are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1B and 2 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of determining a state of charge (SOC) of a battery, the method comprising:
   acquiring battery conservation equations based on a stochastic Pseudo 2-dimensional electrochemical thermal (P2D-ECT) model;
   calculating a stochastic reduced order model (SROM) and a mean using the battery conservation equations;
   combining state information of the battery measured by a sensor with the SROM and the mean;
   determining the SOC of the battery based on a result of the combining; and
   managing the battery based on the determined SOC,
   wherein the stochastic P2D-ECT model is acquired using Hermite polynomials, and each of the Hermite polynomials comprise a basis and a number of terms.

2. The method of claim 1, wherein the calculating comprises calculating the SROM and the mean based on an SOC of the battery that is estimated based on the stochastic P2D-ECT model.

3. The method of claim 1, wherein the determining comprises:
   updating a basis of Hermite polynomials based on a result of the combining; and
   determining the SOC of the battery by performing a basis conversion on the Hermite polynomials based on a result of the updating.

4. The method of claim 1, wherein each of the battery conservation equations corresponds to an equivalent battery conservation equation of the stochastic P2D-ECT model.

5. The method of claim 1, wherein the acquiring comprises:
   acquiring a stochastic partial differential equation (SPDE) by acquiring a spectral expansion of a probability density function (PDF) of an SOC of the battery estimated using Hermite polynomials; and
   acquiring the battery conservation equations by performing a stochastic spectral projection on the SPDE.

6. The method of claim 1, wherein the mean corresponds to a first battery conservation equation acquired based on the stochastic P2D-ECT model.

7. The method of claim 1, wherein the state information comprise state information associated any one or any combination of a voltage, a current, and a temperature of the battery.

8. The method of claim 1, wherein the current SOC of the battery comprises any one or any combination of a terminal voltage, a terminal current, a charging and discharging efficiency, an internal temperature, a charging rate, and a charge density.

9. A non-transitory computer-readable medium storing instructions, that when executed by a processor, causes the processor to perform the method of claim 1.

10. The method of claim 3, wherein, the basis conversion comprises changing coefficients of the SOC.

11. The method of claim 6, wherein the SROM is acquired by performing a volume averaging on the battery conservation equations, excluding the first battery conservation equation of the battery conservation equations.

12. An apparatus for managing a battery, the apparatus comprising:
    a processor configured to:
    acquire battery conservation equations based on a stochastic Pseudo 2-dimensional electrochemical thermal (P2D-ECT) model;
    calculate a stochastic reduced order model (SROM) and a mean using the battery conservation equations;
    combine state information of the battery measured by a sensor with the SROM and the mean;
    determine the state of charge (SOC) of the battery based on a result of the combining; and
    manage the battery based on the determined SOC,
    wherein the stochastic P2D-ECT model is acquired using Hermite polynomials, and each of the Hermite polynomials comprise a basis and a number of terms.

13. The apparatus of claim 12, wherein the processor is further configured to calculate the SROM and the mean based on an SOC of the battery that is estimated based on the stochastic P2D-ECT model.

14. The apparatus of claim 12, wherein the processor is further configured to update a basis of Hermite polynomials based on a result of the combining and to determine the SOC of the battery by performing a basis conversion on the Hermite polynomials based on a result of the updating.

15. The apparatus of claim 12, wherein each of the battery conservation equations corresponds to an equivalent battery conservation equation of the stochastic P2D-ECT model.

16. The apparatus of claim 12, wherein the processor is further configured to acquire a stochastic partial differential equation (SPDE) by acquiring a spectral expansion of a probability density function (PDF) of an SOC of the battery estimated using Hermite polynomials, and to acquire the battery conservation equations by performing a stochastic spectral projection on the SPDE.

17. The apparatus of claim 12, wherein the mean corresponds to a first battery conservation equation acquired based on the stochastic P2D-ECT model.

18. The apparatus of claim 14, wherein the basis conversion comprises changing coefficients of the SOC.

19. The apparatus of claim 17, wherein the SROM is acquired by performing a volume averaging on the battery conservation equations, excluding the first battery conservation equation of the battery conservation equations.

* * * * *